US010541256B2

(12) United States Patent
Xian et al.

(10) Patent No.: US 10,541,256 B2
(45) Date of Patent: Jan. 21, 2020

(54) ARRAY SUBSTRATE AND DISPLAY APPARATUS

(71) Applicant: BOE TECHNOLOGY GROUP CO., LTD., Beijing (CN)

(72) Inventors: Jianbo Xian, Beijing (CN); Xueguang Hao, Beijing (CN); Hongfei Cheng, Beijing (CN); Yongda Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/743,530

(22) PCT Filed: Jul. 14, 2017

(86) PCT No.: PCT/CN2017/092914
§ 371 (c)(1),
(2) Date: Jan. 10, 2018

(87) PCT Pub. No.: WO2018/036298
PCT Pub. Date: Mar. 1, 2018

(65) Prior Publication Data
US 2018/0315774 A1 Nov. 1, 2018

(30) Foreign Application Priority Data
Aug. 22, 2016 (CN) .................... 2016 2 0910651 U

(51) Int. Cl.
H01L 27/12 (2006.01)
G02F 1/1362 (2006.01)

(52) U.S. Cl.
CPC ...... H01L 27/124 (2013.01); G02F 1/136259 (2013.01); G02F 1/136286 (2013.01);
(Continued)

(58) Field of Classification Search
CPC ... G02F 1/136259; G02F 2001/136272; G02F 2001/136263; H01L 27/124
See application file for complete search history.

(56) References Cited

U.S. PATENT DOCUMENTS 9,268,186 B2 * 2/2016 Tong ................. G02F 1/136259
9,470,943 B2 * 10/2016 Tang ................. G02F 1/136259
(Continued)

FOREIGN PATENT DOCUMENTS

CN 102156366 A 8/2011
CN 202171713 U 3/2012
(Continued)

OTHER PUBLICATIONS

International Search Report from PCT Application No. PCT/CN2017/092914 dated Oct. 17, 2017 (5 pages).
(Continued)

Primary Examiner — Jasmine J Clark
(74) Attorney, Agent, or Firm — Dave Law Group LLC; Raj S. Dave

(57) ABSTRACT

An embodiment of the present disclosure relates to an array substrate, which comprises data lines and gate lines arranged on the array substrate having a pixel region and a peripheral region surrounding the pixel region, and at least two repair lines arranged on the peripheral region of the array substrate. The at least two repair lines intersect with one of the data lines and the gate lines. Each of the repair lines has at least one repair voltage lead. The array substrate according to the present disclosure can increase the number of data lines or gate lines that can be repaired, improve a utilization ratio of the repair lines, and can be used for repairing a display panel with large area.

20 Claims, 3 Drawing Sheets

(52) U.S. Cl.
CPC .......... *G02F 2001/136263* (2013.01); *G02F 2001/136272* (2013.01)

(56) References Cited

U.S. PATENT DOCUMENTS

| | | |
|---|---|---|
| 10,068,813 B2 * | 9/2018 | Wu .................. G02F 1/136259 |
| 2005/0195338 A1 | 9/2005 | Matsumoto et al. |
| 2006/0103410 A1 * | 5/2006 | Jeon ....................... G09G 3/006 |
| | | 324/760.02 |
| 2009/0021665 A1 * | 1/2009 | Shiao ................ G02F 1/136259 |
| | | 349/54 |
| 2015/0212379 A1 | 7/2015 | Wang et al. |
| 2017/0249050 A1 | 8/2017 | Xi et al. |

FOREIGN PATENT DOCUMENTS

| | | |
|---|---|---|
| CN | 103235459 A | 8/2013 |
| CN | 105786253 A | 7/2016 |
| CN | 205910472 U | 1/2017 |

OTHER PUBLICATIONS

Written Opinion from PCT Application No. PCT/CN2017/092914 dated Oct. 17, 2017 (5 pages).

\* cited by examiner

ARRAY SUBSTRATE AND DISPLAY APPARATUS

CROSS-REFERENCE TO RELATED APPLICATION

This application claims the benefit and priority of Chinese Patent Application No. 201620910651.9 filed on Aug. 22, 2016, the entire content of which is incorporated herein by reference as a part of the present application.

TECHNICAL FIELD

The present disclosure generally relates to the field of display technologies, and more particularly, to an array substrate and a display apparatus.

BACKGROUND

As the most widely used display technology at present, the liquid crystal display technology is widely used for televisions, mobile phones and public information display. An existing liquid crystal display array substrate includes a substrate. The substrate includes a pixel region and a peripheral region surrounding the pixel region. A plurality of data lines, gate lines and pixel units are arranged on the substrate. The pixel units are formed into matrices which are defined by a plurality of intersecting data lines and gate lines formed on the substrate. Each pixel unit is provided with a thin film transistor (TFT). The gate lines are configured to drive the pixel units in their corresponding rows. The data lines are configured to provide voltages for the pixel electrodes in the pixel units in their corresponding columns.

In a manufacturing process of the array substrate, a breakpoint of any data line or gate line on the array substrate may cause a defect of the display panel, thereby having a negative display effect on a display product.

BRIEF DESCRIPTION

Embodiments described in the present disclosure provide an array substrate and a display apparatus, which can increase the number of data lines or gate lines that can be repaired and improve a utilization ratio of repair lines.

A first aspect of the present disclosure provides an array substrate. The array substrate includes data lines and gate lines arranged on the array substrate having a pixel region and a peripheral region, and at least two repair lines arranged on the peripheral region of the array substrate. The at least two repair lines intersect with one of the data lines and the gate lines, and each of the repair lines has at least one repair voltage lead.

According to an embodiment of the present disclosure, each of the repair lines has one repair voltage lead, and the repair voltage lead is positioned at an end, on a same side, of the repair line.

According to an embodiment of the present disclosure, each of the repair lines has one repair voltage lead. The repair voltage lead of at least one of the repair lines, relative to the repair voltage leads of other repair lines, is positioned at an end, on a different side, of the repair line.

According to an embodiment of the present disclosure, the at least two repair lines include two repair lines, and each of the repair lines has only one repair voltage lead. The repair voltage lead of one of the two repair lines, relative to the repair voltage lead of the other of the two repair lines, is positioned at an end, on a different side, of the repair line.

According to an embodiment of the present disclosure, the data lines and the gate lines are connected respectively to a corresponding integrated circuit (IC) positioned at a side, opposite to the pixel region, of the repair line.

According to a further embodiment of the present disclosure, at least one repair voltage lead is positioned between adjacent ICs.

According to an embodiment of the present disclosure, the repair lines are divided into a plurality of repair line groups. Each of the repair line groups includes at least two repair lines and intersects only with the data lines or gate lines connected to a same IC. At least one end of at least one of the repair lines in each of the repair line groups is provided with the repair voltage lead.

According to a further embodiment of the present disclosure, at least one of the repair voltage leads is positioned between adjacent ICs.

According to a further embodiment of the present disclosure, each of the repair line groups corresponds to 300~400 data lines or gate lines.

According to an embodiment of the present disclosure, one of the data lines and the gate lines are arranged at a same layer with the repair lines.

According to an embodiment of the present disclosure, the repair voltage leads and the repair lines are arranged at the same layer.

According to an embodiment of the present disclosure, the repair voltage leads and the repair lines are positioned at different layers and are electrically connected.

According to an embodiment of the present disclosure, voltages introduced by the repair voltage leads of the at least two repair lines are equal or different.

According to an embodiment of the present disclosure, the data lines or the gate lines to be repaired is electrically connected, at an intersection, to a corresponding one of the repair lines.

According to an embodiment of the present disclosure, the repair voltage lead of at least one of the repair lines is positioned between two adjacent data lines or gate lines.

According to the further embodiment of the present disclosure, the electrical connection includes a welded connection.

According to an embodiment of the present disclosure, the array substrate further includes common electrode lines. The common electrode lines include at least one common electrode lead. At least one of the repair voltage leads is positioned between one data line or one gate line and the common electrode lead. Alternatively, at least one of the repair voltage leads is not overlapped with the common electrode lead.

A second aspect of the present disclosure provides a display apparatus. The display apparatus includes the array substrate according to any one of the above embodiments.

In the aforementioned array substrate and a liquid crystal display panel and a display apparatus using the array substrate, the number of data lines or gate lines that can be repaired may be increased by arranging at least two repair lines, so that the utilization ratio of the repair lines can be improved. Further, by arranging at least two repair lines and providing for each repair line a plurality of repair voltage leads, it facilitates the introduction of a repair voltage at an expected position. According to an embodiment of the present disclosure, the repair voltage may be introduced by a selected repair voltage lead that has the shortest electrical path to the data line or gate line to be repaired. In this way, the problem of uneven voltage caused by an overlong electrical path is solved.

BRIEF DESCRIPTION OF THE DRAWINGS

Detailed description of embodiments of the present disclosure will further be made with reference to drawings in order to make the objectives, technical solutions and advantages of the present disclosure more apparent. In the accompanying drawings, the same reference number represents the same element. Those skilled in the art will appreciate that the specific embodiments described with reference to the accompanying drawings merely serve as examples of the technical solutions of the present disclosure rather than limitations thereto. In the drawings.

DETAILED DESCRIPTION

The exemplary embodiments will now be described more fully with reference to the accompanying drawings. The following embodiments are used to repair data lines, as an example. However, those skilled in the art should understand that the following embodiments may be appropriately amended to repair gate lines.

The present disclosure provides an array substrate, which includes data lines and gate lines arranged on the array substrate having a pixel region and a peripheral region surrounding the pixel region, and at least two repair lines arranged on the peripheral region of the array substrate. The repair lines intersect with the data lines. Each of the repair lines has at least one repair voltage lead.

In a traditional repair method, one repair line can only repair one data line. Therefore, in the present disclosure, at least two repair lines may repair at least two data lines. As a consequence, the number of the data lines that can be repaired is increased, and the utilization ratio of the repair lines is improved.

Figure 1:
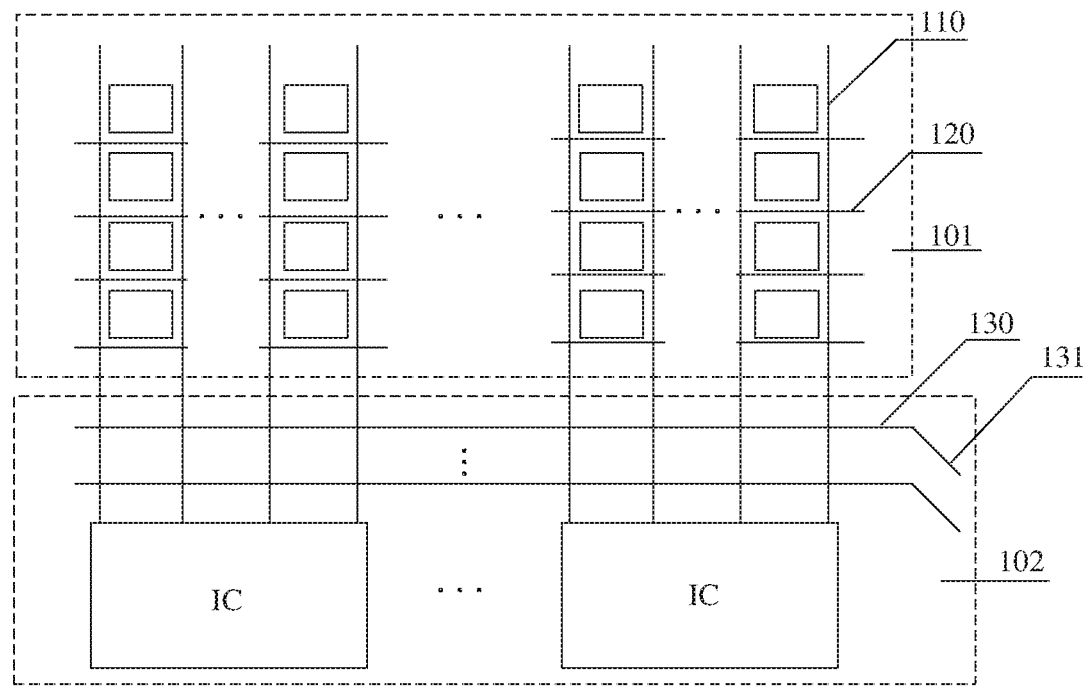
FIG. 1 illustrates a schematic structural diagram of an array substrate according to a first embodiment of the present disclosure.

FIG. 1 illustrates a schematic structural diagram of an exemplary array substrate according to a first embodiment of the present disclosure. As shown in FIG. 1, the array substrate 100 includes a pixel region 101 and a peripheral region 102. Typically, the peripheral region 102 is arranged around the pixel region 101 (FIG. 1 only displays a portion of the peripheral region). The array substrate 100 is provided with a plurality of data lines 110 and a plurality of gate lines 120. The peripheral region 102 is provided with at least two repair lines 130. In an example, the data lines 110 are further connected to a corresponding integrated circuit (IC) positioned at a side, opposite to the pixel region 101, of the repair line 130. The IC provides input voltages for the data lines 110. The repair lines 130 intersect with the data lines 110 to repair the data lines 110. In an example, the repair lines 130 may be, for example, in parallel with the gate lines 120. In this embodiment, each repair line 130 has one repair voltage lead 131, which is positioned at an end, on the same side, of the repair line 130.

In this embodiment, by providing at least two repair lines 130, the number of the data lines 110 that can be repaired may be increased. In addition, by providing at least two repair lines 130, equal or different voltages may be flexibly introduced by different repair lines 130 based on different repair demands.

This embodiment only introduces the peripheral region as shown in FIG. 1 as an example. However, it is to be understood that in other peripheral regions not shown, the corresponding repair lines and repair voltage leads may be arranged as needed.

Figure 2:
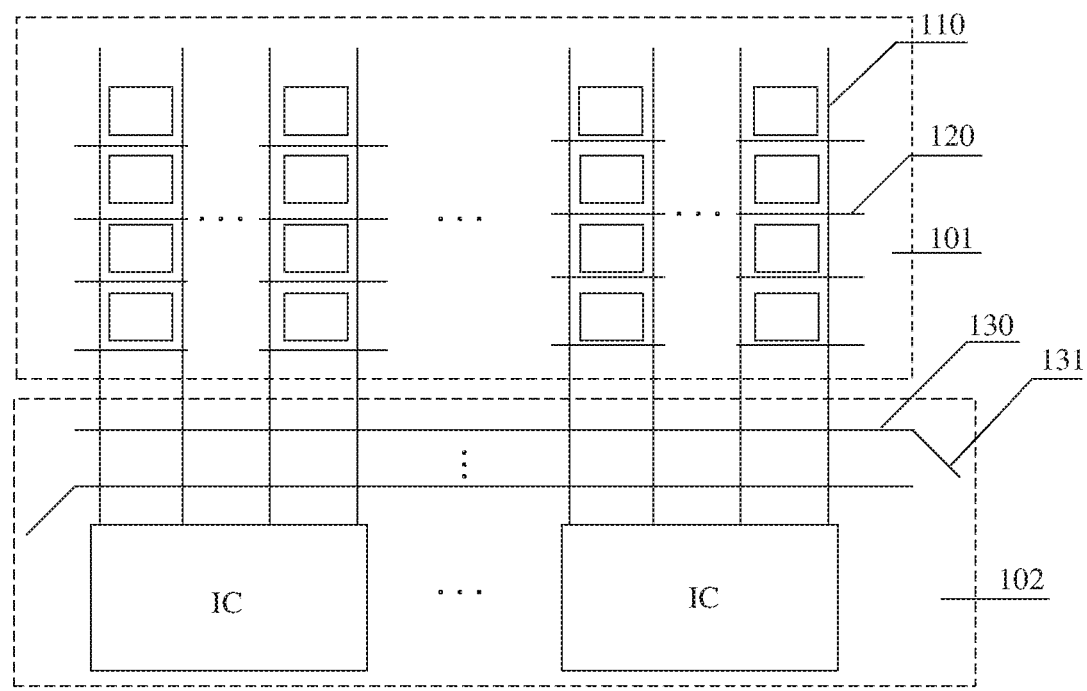
FIG. 2 illustrates a schematic structural diagram of an array substrate according to a second embodiment of the present disclosure.

FIG. 2 illustrates a schematic structural diagram of an exemplary array substrate according to a second embodiment of the present disclosure. As shown in FIG. 2, the array substrate 100 has a pixel region 101 and a peripheral region 102 around the pixel region 101. The array substrate 100 is provided with a plurality of data lines 110 and a plurality of gate lines 120. The peripheral region 102 is provided with at least two repair lines 130. In an example, the data lines 110 are further connected to a corresponding integrated circuit (IC) positioned at a side, opposite to the pixel region 101, of the repair line 130. The IC provides input voltages for the data lines 110. The repair lines 130 intersect with the data lines 110 to repair the data lines 110. In an example, the repair lines 130 may be, for example, in parallel with the gate lines 120. In this embodiment, each repair line 130 has one repair voltage lead 131. The repair voltage lead 131 of at least one of the repair lines 130, relative to the repair voltage leads 131 of other repair lines 130, is positioned at an end, on a different side, of the repair line 130. In addition, in an example of this embodiment, the at least two repair lines 130 may include two repair lines 130. Each of the repair lines 130 only has one repair voltage lead 131. The repair voltage lead 131 of one of the two repair lines 130, relative to the repair voltage lead 131 of the other of the two repair lines 130, is positioned at an end, on a different side, of the repair line 130.

For a display panel with large area, the electrical path from the repair voltage lead 131 to the data line 110 to be repaired is overlong, the signal attenuation is severe, and the repair difficulty is high. By arranging the repair voltage lead 131 of at least one of the repair lines 130, at an end, on a different side relative to the repair voltage leads 131 of other repair lines 130, of the repair line 130, when repairing the data lines 110, a repairer may select a repair voltage lead 131 that has the shortest electrical path to the data line 110 to be repaired, and introduce a voltage into the data line 110 to be repaired by that repair voltage lead 131. In this way, the problem of uneven voltage caused by an overlong electrical path is solved, and a repair success rate is improved.

Figure 3:
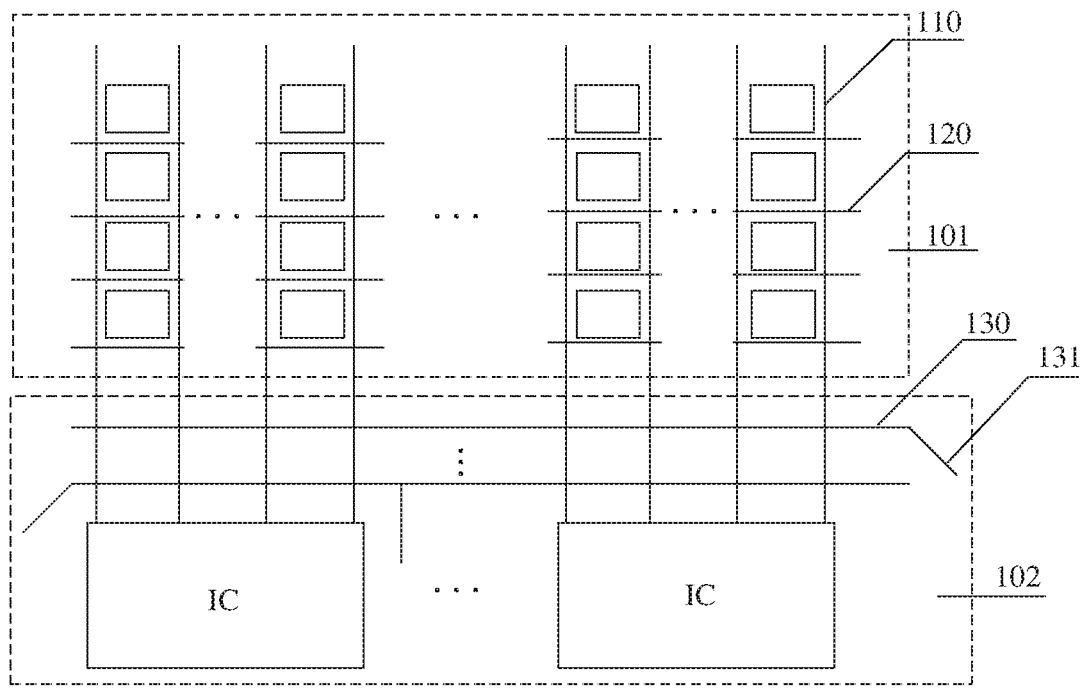
FIG. 3 illustrates a schematic structural diagram of an array substrate according to a third embodiment of the present disclosure.

Further, FIG. 3 illustrates a schematic structural diagram of an exemplary array substrate according to a third embodiment of the present disclosure. In this embodiment, the array substrate 100 has a pixel region 101 and a peripheral region 102 around the pixel region 101. The array substrate 100 is provided with a plurality of data lines 110 and a plurality of gate lines 120. The peripheral region 102 is provided with at least two repair lines 130. In an example, the data lines 110 are further connected to a corresponding integrated circuit (IC) positioned at a side, opposite to the pixel region 101, of the repair line 130. The IC provides input voltages for the data lines 110. The repair lines 130 intersect with the data lines 110 to repair the data lines 110. In an example, the repair lines 130 may be, for example, in parallel with the gate lines 120. In this embodiment, each repair line 130 has at least one repair voltage lead 131, and at least one repair voltage lead 131 may be arranged between adjacent ICs. This configuration may make the best use of layout space, and increase the utilization ratio of the repair lines 130. In addition, when the data line 110 is disconnected, this configuration may also enable the introduction of a voltage into the data line 110 to be repaired from, for example, the repair voltage lead 131 closest to the IC, via the corresponding repair line 130. In this way, the electrical path from the repair voltage lead 131 to the data line 110 to be repaired is further shortened, and the voltage loss from the repair voltage lead 131 to the data line 110 to be repaired is reduced.

Figure 4:
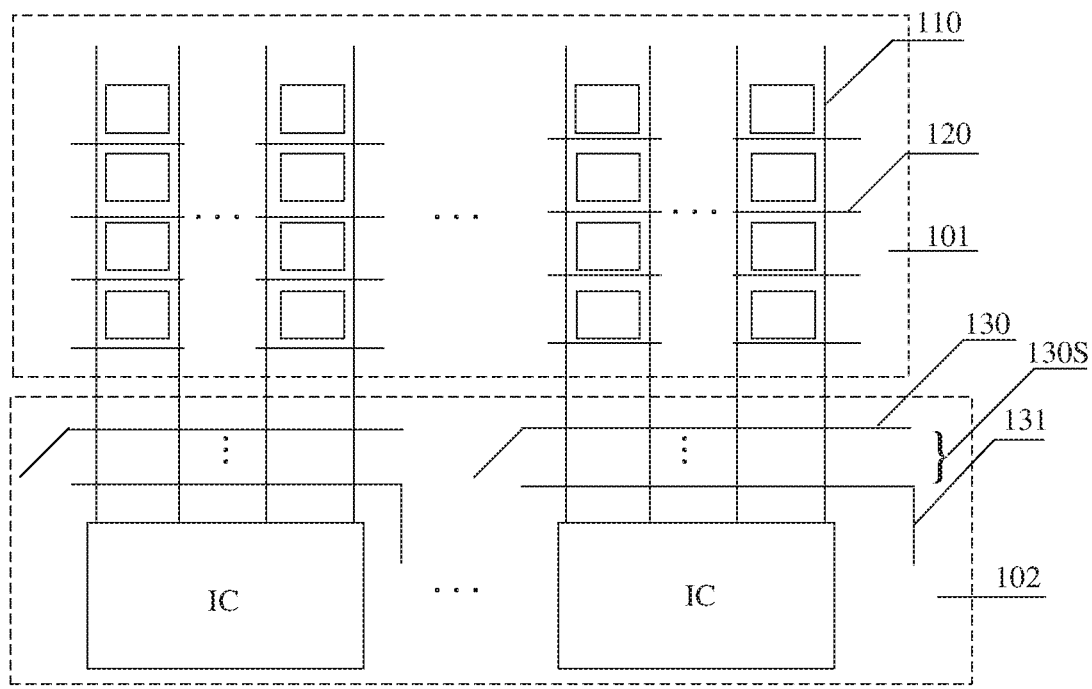
FIG. 4 illustrates a schematic structural diagram of an array substrate according to a fourth embodiment of the present disclosure.

Further, FIG. 4 illustrates a schematic structural diagram of an exemplary array substrate according to a fourth exemplary embodiment of the present disclosure. In this embodiment, as shown in FIG. 4, the array substrate 100 has a pixel region 101 and a peripheral region 102 around the pixel region 101. The array substrate 100 is provided with a plurality of data lines 110 and a plurality of gate lines 120. The peripheral region 102 is provided with a plurality of repair line groups 130S, each of which includes at least two repair lines 130. The data lines 110 are connected to a corresponding IC positioned at a side, opposite to the pixel region 101, of the repair line group 130S. Each repair line group 130S intersect only with the data lines 110 (for example, 300~400 data lines 110) connected to the same IC. At least one end of at least one repair line 130 in each of the repair line groups 130S is provided with the repair voltage lead 131. In an example, at least one repair voltage lead 131 of the repair lines 130 is positioned between adjacent ICs.

First, each repair line group 130S, in this embodiment, may respectively repair at least two data lines 110. As a consequent, the number of the data lines 110 that can be repaired may be increased. Second, because the repair voltage lead 131 is positioned between adjacent ICs, when repairing the data line 110, it is unnecessary to introduce a voltage into the data line 110 from two ends of the display panel, but the voltage may be partially provided according to the actual need. In this way, the electrical path from the repair voltage lead 131 to the data line 110 to be repaired is shorter. Particularly, a conduction path of the repairing voltage may be effectively reduced for repairing the data lines 110 in a middle part of the array substrate. In addition, each repair line group 130S (corresponding to, for example, 300~400 data lines 110 connected to the same IC) has at least one repair voltage lead 131. Therefore, the voltage introduced into the repair line 130 may be flexibly adjusted for the voltage of each IC, so as to implement repair by region.

Figure 5:
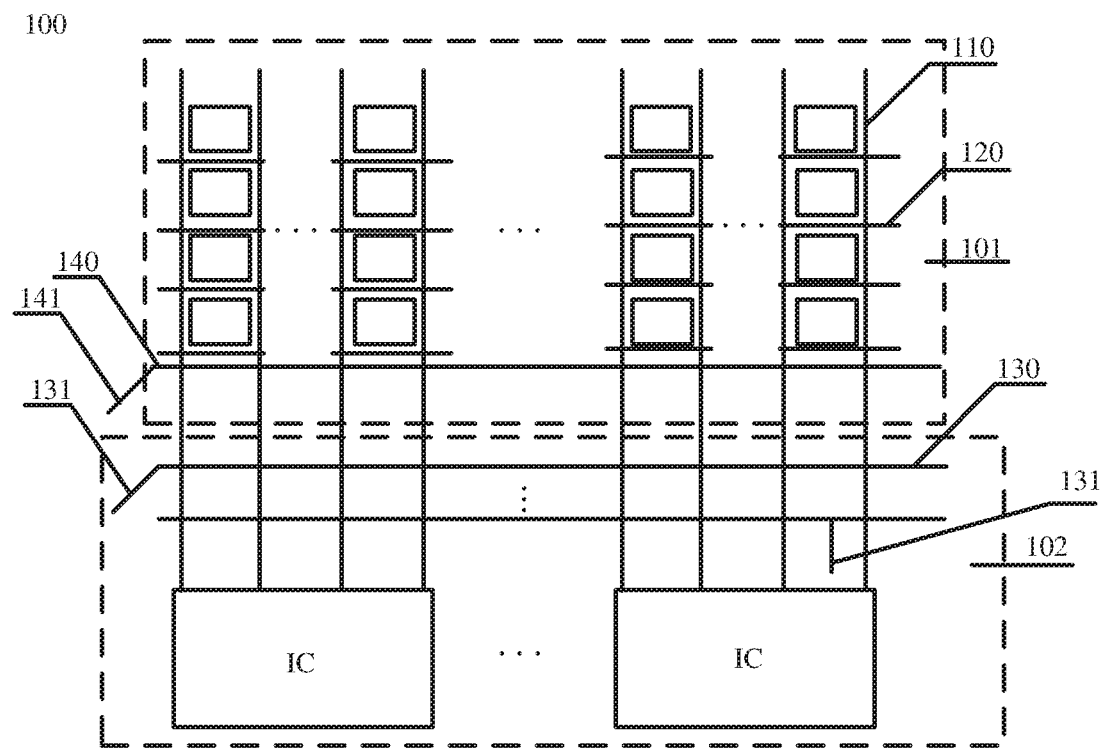
FIG. 5 illustrates a schematic structural diagram of an array substrate according to a fifth embodiment of the present disclosure.

FIG. 5 illustrates a schematic structural diagram of an array substrate according to a fifth embodiment of the present disclosure. In the array substrate 100, the repair voltage lead 131 of at least one repair line 130 may also be arranged between two adjacent data lines 110. When the data line 110 is disconnected, this configuration may enable the introduction of a voltage into the data line 110 to be repaired from, for example, the repair voltage lead 131 closest to the data line 110 to be repaired, via the corresponding repair line 130. In this way, the electrical path from the repair voltage lead 131 to the data line 110 to be repaired is further shortened, and voltage loss from the repair voltage lead 131 to the data line 110 to be repaired is reduced.

As to any one of the above embodiments, common electrode lines 140 (only illustrated in FIG. 5) are typically arranged in the pixel region 101. For example, adjacent to each gate line 120 (or each data line 110 in an alternative embodiment) there is provided with one common electrode line 140 in parallel with the gate line 120. The common electrode lines 140 need to be led out to the peripheral region 102 via common electrode leads 141, so that the common electrode lines 140 are electrically connected to a common voltage signal source. In the embodiment as shown in FIG. 5, only one common electrode lines 140 and one common electrode lead 141 is schematically illustrated. To reduce interference between the repair voltage leads 131 and the common electrode leads 141 as much as possible, at least one repair voltage lead 131 is not overlapped with the common electrode lead 141. Alternatively, at least one repair voltage lead 131 is arranged away from the common electrode lead 141 by a certain distance. For example, at least one repair voltage lead 131 is positioned between the data lines 110 (or the gate lines 120 in an alternative embodiment) and the common electrode leads 141; or at least one common electrode lead 141 is positioned between the repair voltage leads 131 and the gate lines 120 (or the data lines 110 in an alternative embodiment).

As to any one of the above embodiments, the gate lines 120 and the repair lines 130 may be arranged at the same layer. Voltages introduced by the repair voltage leads 131 of the repair lines 130 may be equal or different. The repair voltage leads 131 and the repair lines 130 may be arranged at the same layer, or may be arranged at different layers and be electrically connected. When repairing, a corresponding repair line 130 is selected from the repair lines 130, and is electrically connected to the data line 110 to be repaired at an intersection position. It is possible that the repair lines 130 may not be arranged at the same layer with the gate lines 120 or data lines 110, for example by utilizing, a material layer for the pixel electrodes (or common electrode layer) or a separated metal layer which can be patterned to form the repair lines 130.

Further, the selected repair line 130 has a repair voltage lead 131 having the shortest electrical path to the data line 110 to be repaired, and the voltage is introduced into the data line 110 to be repaired by that repair voltage lead 131. The electrical connection between the repair line 130 and the data line 110 to be repaired at the intersection position may be, for example, a welded connection.

Figure 6:
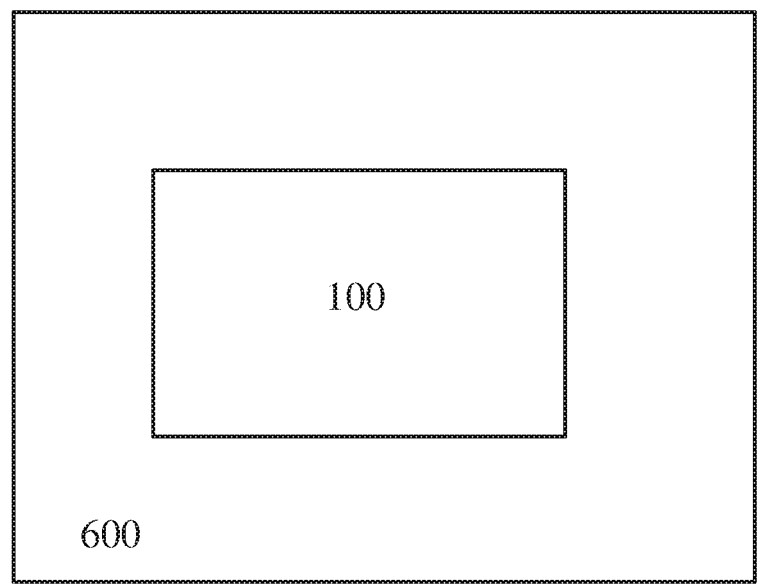
FIG. 6 illustrates a schematic structural diagram of a display apparatus according to an embodiment of the present disclosure.

FIG. 6 illustrates a schematic structural diagram of a display apparatus 600 according to an embodiment of the present disclosure. The display apparatus 600 includes an array substrate 100 provided by any one of the above embodiments. Therefore, description of the structure, function and effect as to the array substrate 100 in the above embodiments is also applicable to the display apparatus 600 in this embodiment.

The display device provided by the embodiment of the present disclosure may be used for any product having a display function, such as an LCD, an OLED, an electronic paper display, a mobile phone, a tablet computer, a TV set, a notebook computer, a digital photo frame, or a navigation device and so on.

Further adaptive aspects and scopes become apparent from the description provided herein. It is understood that various aspects of the present disclosure may be implemented separately or in combination with one or more other aspects. It is also understood that the description and specific embodiments in the present disclosure are only for the purpose of illustration and are not intended to limit the scope of the present disclosure.

As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted as inclusively rather than exclusively. Likewise, the terms "include" and "or" should be construed to be inclusive, unless such an interpretation is clearly prohibited from the context. Where used herein the term "examples," particularly when followed by a listing of terms is merely exemplary and illustrative, and should not be deemed to be exclusive or comprehensive.

The preceding description of the embodiments is provided for the purpose of illustration and description, and is not intended to be exhaustive or to limit the present disclosure. Various components or features of specific embodiments generally are not limited to specific embodiments. However, these components and features are interchangeable and may be used in selected embodiments even without specific illustration or description, if appropriate. Likewise, amendments may be made in many ways. These amendments are not deemed to be departed from the present disclosure, and all these amendments are included in the scope of the present disclosure.

What is claimed is:

1. An array substrate comprising:
   a pixel region and a peripheral region;
   data lines and gate lines; and
   at least two repair lines arranged on the peripheral region of the array substrate;
   wherein the at least two repair lines intersect with the data lines or the gate lines, and each of the repair lines has at least one repair voltage lead.

2. The array substrate according to claim 1, wherein each of the repair lines has only one repair voltage lead positioned at a first end of its repair line.

3. The array substrate according to claim 1, wherein each of the repair lines has only one repair voltage lead, and wherein at least one of the repair voltage leads of the repair lines is positioned at a first end of its repair line and the other of the repair voltage leads are positioned at a second end of their repair line.

4. The array substrate according to claim 1, wherein the at least two repair lines comprise two repair lines, wherein each of the two repair lines has only one repair voltage lead, and wherein one repair voltage lead is positioned at a first end of its repair line and the other repair voltage lead is positioned at a second end of its repair line.

5. The array substrate according to claim 1, wherein in the case that the repair lines intersect with the data lines, the data lines are connected to corresponding integrated circuits positioned at a side, opposite to the pixel region, of the repair lines, and wherein in the case that the repair lines intersect with the gate lines, the gate lines are connected to corresponding integrated circuits positioned at a side, opposite to the pixel region, of the repair lines.

6. The array substrate according to claim 5, wherein at least one repair voltage lead is positioned between adjacent integrated circuits.

7. The array substrate according to claim 5, wherein the repair lines are divided into a plurality of repair line groups, wherein in the case that the repair lines intersect with the data lines, each of the repair line groups comprises at least two repair lines intersecting only with the data lines connected to a same integrated circuit, wherein in the case that the repair lines intersect with the gate lines, each of the repair line groups comprises at least two repair lines intersecting only with the gate lines connected to a same integrated circuit, and wherein at least one end of at least one of the repair lines in each of the repair line groups is provided with the repair voltage lead.

8. The array substrate according to claim 7, wherein at least one of the repair voltage leads is positioned between adjacent integrated circuits.

9. The array substrate according to claim 1, wherein in the case that the repair lines intersect with the data lines, the gate lines are arranged on a same layer with the repair lines, and wherein in the case that the repair lines intersect with the gate lines, the data lines are arranged on a same layer with the repair lines.

10. The array substrate according to claim 9, wherein voltages introduced by the repair voltage leads of the at least two repair lines are equal or different.

11. The array substrate according to claim 9, wherein the repair voltage leads and the repair lines are positioned at different layers and are electrically connected.

12. The array substrate according to claim 9, wherein in the case that the repair lines intersect with the data lines, the data line to be repaired is electrically connected, at an intersection, to a corresponding one of the repair lines, and wherein in the case that the repair lines intersect with the gate lines, the gate line to be repaired is electrically connected, at an intersection, to a corresponding one of the repair lines.

13. The array substrate according to claim 1, wherein the repair voltage lead of at least one of the repair lines is positioned between two adjacent data lines or gate lines.

14. The array substrate according to claim 1, further comprising common electrode lines including at least one common electrode lead; and
   wherein at least one of the repair voltage leads is positioned between one data line or one gate line and the common electrode lead; or at least one of the repair voltage leads is not overlapped with the common electrode lead.

15. A display apparatus comprising the array substrate according to claim 1.

16. The array substrate according to claim 4, further comprising common electrode lines including at least one common electrode lead; and
   wherein at least one of the repair voltage leads is positioned between one data line or one gate line and the common electrode lead; or at least one of the repair voltage leads is not overlapped with the common electrode lead.

17. The array substrate according to claim 5, further comprising common electrode lines including at least one common electrode lead; and
   wherein at least one of the repair voltage leads is positioned between one data line or one gate line and the common electrode lead; or at least one of the repair voltage leads is not overlapped with the common electrode lead.

18. The array substrate according to claim 6, further comprising common electrode lines including at least one common electrode lead; and
   wherein at least one of the repair voltage leads is positioned between one data line or one gate line and the common electrode lead; or at least one of the repair voltage leads is not overlapped with the common electrode lead.

19. The array substrate according to claim 7, further comprising common electrode lines including at least one common electrode lead; and wherein at least one of the repair voltage leads is positioned between one data line or one gate line and the common electrode lead; or at least one of the repair voltage leads is not overlapped with the common electrode lead.

20. The array substrate according to claim 8, further comprising common electrode lines including at least one common electrode lead; and wherein at least one of the repair voltage leads is positioned between one data line or one gate line and the common electrode lead; or at least one of the repair voltage leads is not overlapped with the common electrode lead.

\* \* \* \* \*